(12) United States Patent
Lin

(10) Patent No.: US 10,251,298 B1
(45) Date of Patent: Apr. 2, 2019

(54) COMPUTER CASE

(71) Applicant: THERMALTAKE TECHNOLOGY CO., LTD., Taipei (TW)

(72) Inventor: Pei-Hsi Lin, Taipei (TW)

(73) Assignee: THERMALTAKE TECHNOLOGY CO., LTD. (TW)

( * ) Notice: Subject to any disclaimer, the term of this patent is extended or adjusted under 35 U.S.C. 154(b) by 0 days.

(21) Appl. No.: 16/011,664

(22) Filed: Jun. 19, 2018

(30) Foreign Application Priority Data

Apr. 19, 2018 (TW) .............................. 107205124 U

(51) Int. Cl.
*H05K 7/14* (2006.01)
*G06F 1/18* (2006.01)
*H05K 7/18* (2006.01)

(52) U.S. Cl.
CPC ......... *H05K 7/1418* (2013.01); *H05K 7/1431* (2013.01); *G06F 1/185* (2013.01); *H05K 7/183* (2013.01)

(58) Field of Classification Search
None
See application file for complete search history.

(56) References Cited

U.S. PATENT DOCUMENTS

| 4,971,563 | A | * | 11/1990 | Wells, III | G06F 1/181 361/679.4 |
|---|---|---|---|---|---|
| 5,036,481 | A | * | 7/1991 | Lunsford | G06F 1/18 361/679.32 |
| 5,564,930 | A | * | 10/1996 | Yu | G06F 1/181 361/679.41 |
| 6,462,959 | B1 | * | 10/2002 | Fu | G06F 1/184 211/41.17 |
| 7,626,830 | B2 | * | 12/2009 | Fan | G06F 1/185 361/752 |
| 9,292,055 | B2 | * | 3/2016 | Wu | G06F 1/185 |
| 9,753,505 | B2 | * | 9/2017 | Chen | G06F 1/186 |
| 2004/0174687 | A1 | * | 9/2004 | Wang | G06F 1/184 361/801 |
| 2008/0183933 | A1 | * | 7/2008 | Peng | G06F 1/181 710/302 |

* cited by examiner

*Primary Examiner* — Xanthia C Cunningham
(74) *Attorney, Agent, or Firm* — Schmeiser, Olsen & Watts, LLP

(57) ABSTRACT

A computer case has a box having a back board with an opening; and a graphics card fixing board having a plurality of graphics card shields, wherein the graphics card fixing board corresponds in position to the opening of the back board and thereby is unfastenably attached to the back board of the box either longitudinally or transversely, allowing the graphics card shields to be lengthwise parallel to a height of the box whenever the graphics card fixing board is attached to the back board of the box longitudinally, and allowing the graphics card shields to be lengthwise perpendicular to the height of the box whenever the graphics card fixing board is attached to the back board of the box transversely. Therefore, a graphics card is selectively mounted in place, lying or upright, in the computer case.

10 Claims, 4 Drawing Sheets

COMPUTER CASE

CROSS-REFERENCE TO RELATED APPLICATION

This non-provisional application claims priority under 35 U.S.C. § 119(a) on Patent Application No(s). 107205124 filed in Taiwan, R.O.C. on Apr. 19, 2018, the entire contents of which are hereby incorporated by reference.

TECHNICAL FIELD

The present disclosure relates to computer cases and, more particularly, to a computer case which contains a graphics card mounted in place, lying or upright.

RELATED ART

A plurality of slender graphics card shields is disposed on a back board of a conventional closed computer case. The graphics card shields prevent exposure of a graphics card to dust and foreign bodies which have intruded into the computer case. Mounting the graphics card in place inside the computer case requires: removing the graphics card shields, which are otherwise disposed on the back board and correspond in position to the graphics card, to therefore form an opening left behind by the removed graphics card shields; and then protruding a connector of the graphics card out of the back board through the opening. To align with slots of the graphics card shields, it is necessary for the graphics card to be horizontally disposed in the computer case. As a result, the graphics card disposed in the computer case is restricted to a fixed orientation and thus confined to a specific space to the detriment of space efficiency of the computer case.

SUMMARY

In view of the aforesaid drawbacks of the prior art, it is an objective of the present disclosure to provide a computer case, comprising: a box having a back board with an opening; and a graphics card fixing board comprising a plurality of graphics card shields, wherein the graphics card fixing board corresponds in position to the opening of the back board and thereby is unfastenably attached to the back board of the box either longitudinally or transversely, allowing the graphics card shields to be lengthwise parallel to a height of the box whenever the graphics card fixing board is attached to the back board of the box longitudinally, and allowing the graphics card shields to be lengthwise perpendicular to the height of the box whenever the graphics card fixing board is attached to the back board of the box transversely.

The computer case further comprises: a support base disposed in an internal space of the box and on a surface of the graphics card fixing board, the surface facing the internal space of the box; a graphics card support erected on the support base; and a graphics card adapting line for connecting a graphics card to a motherboard.

The computer case further comprises a fastening component for fastening the graphics card fixing board to the back board of the box.

Regarding the computer case, the box has a first lateral board and a second lateral board, the first lateral board fixing a motherboard in place, and the second lateral board being parallel to the first lateral board and made of a transparent material.

Regarding the computer case, the box has a front board and a top board, both made of a transparent material, and so are the back board and the first lateral board.

Therefore, the graphics card is selectively mounted in place, lying or upright, in the computer case, thereby enhancing space efficiency of the computer case.

BRIEF DESCRIPTION OF THE DRAWINGS

Objectives, features, and advantages of the present disclosure are hereunder illustrated with specific embodiments in conjunction with the accompanying drawings, in which.

DETAILED DESCRIPTION OF THE PREFERRED EMBODIMENTS

Figure 1:
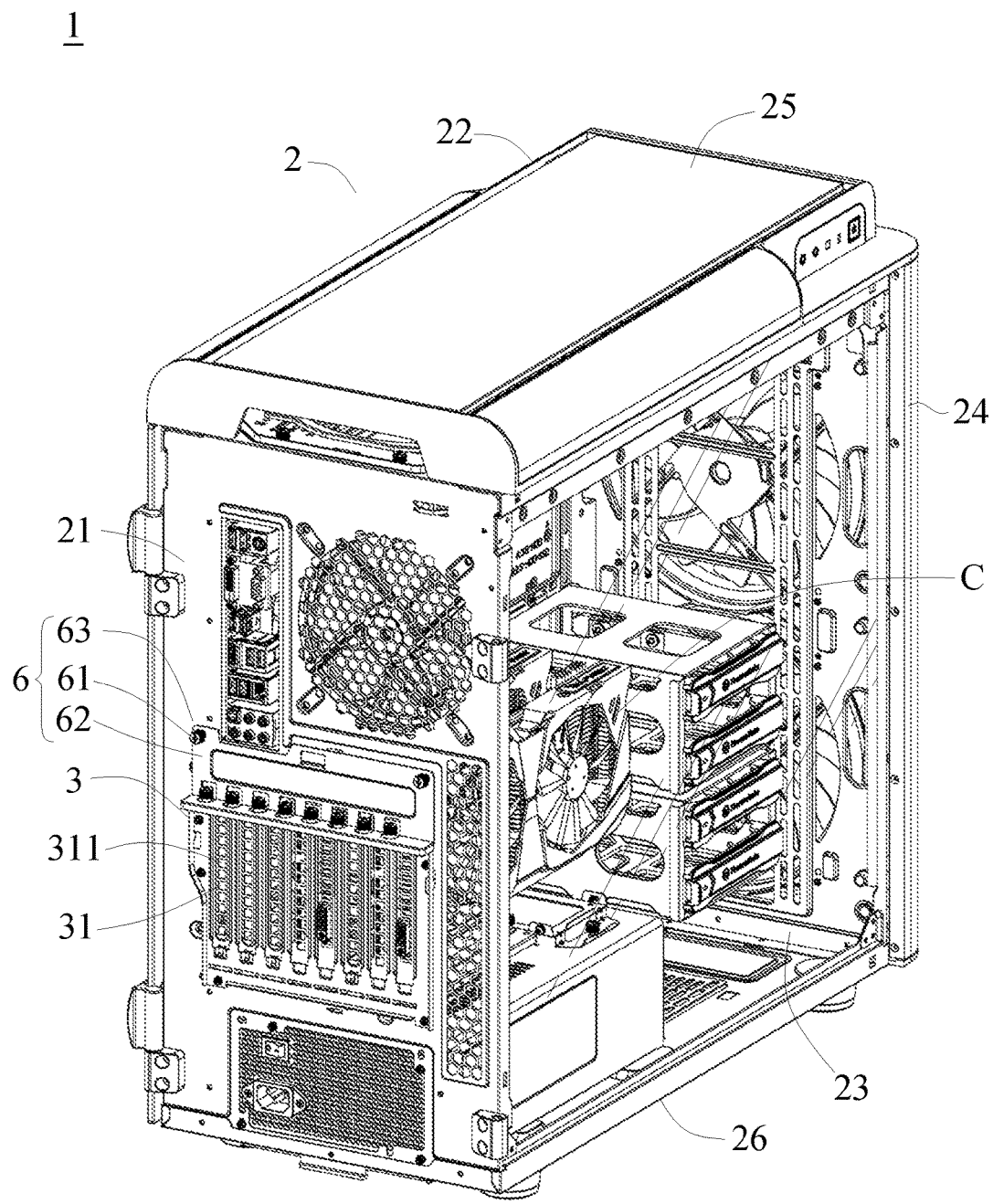
FIG. 1 is a schematic view of a computer case structured in a first mode according to an embodiment of the present disclosure.
Figure 2:
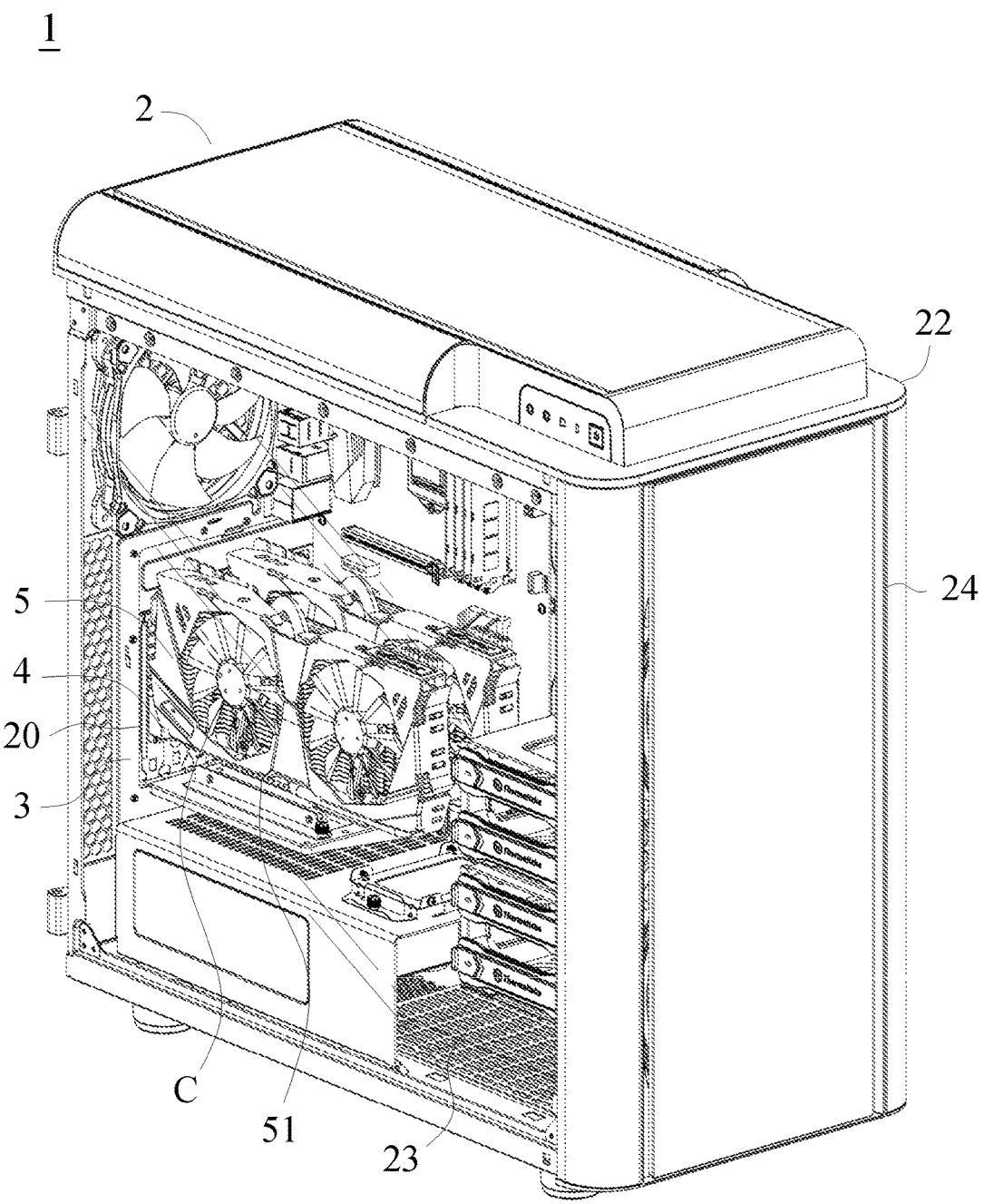
FIG. 2 is a schematic view, from another angle, of the computer case structured in the first mode according to the embodiment of the present disclosure.

Referring to FIGS. 1-4, a computer case 1 is provided according to an embodiment of the present disclosure. As shown in FIG. 1 and FIG. 2, the computer case 1 comprises a box 2 and a graphics card fixing board 3. The box 2 comprises six boards as follows: a front board 24, a back board 21, a first lateral board 22, a second lateral board 23, a top board 25 and a bottom board 26. The back board 21 of the box 2 has an opening 20. The graphics card fixing board 3 comprises a plurality of graphics card shields 31. The graphics card shields 31 each have a plurality of holes 311. In a variant embodiment, the graphics card shields 31 each have one hole 311 or lack any hole. The graphics card fixing board 3 corresponds in position to the opening 20 of the back board 21 and thus is unfastenably attached to the back board 21 of the box 2 longitudinally or transversely.

As shown in FIG. 1 and FIG. 2, when attached to the back board 21 of the box 2 longitudinally, the graphics card shields 31 are lengthwise parallel to the height of the box 2 (that is, the graphics card shields 31 have an orientation different from that of their conventional counterparts by 90 degrees.) Hence, a graphics card C must also have an orientation different from that of its conventional counterpart by 90 degrees in order to be disposed in the box 2, thereby requiring the graphics card C to be upright.

Figure 3:
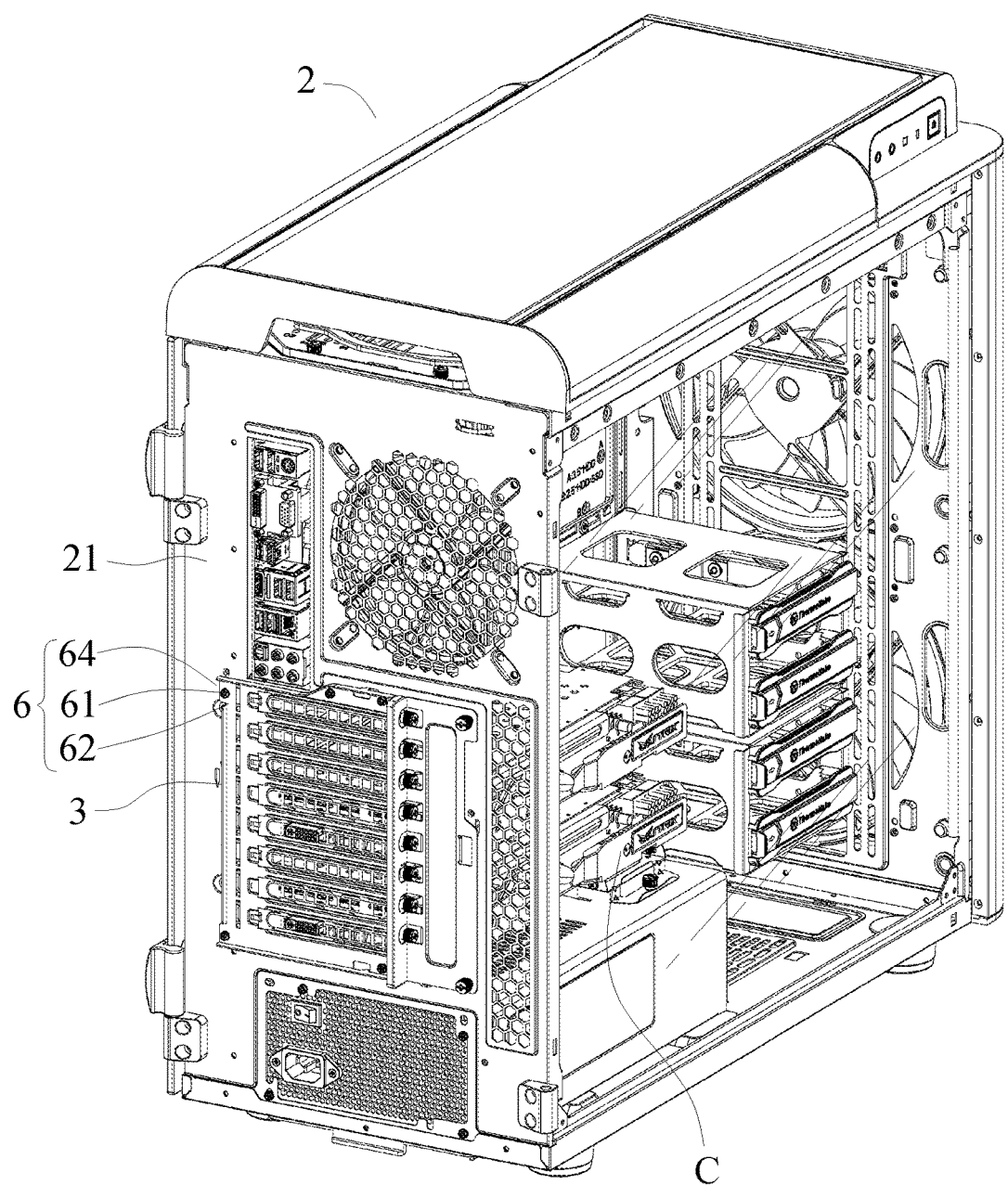
FIG. 3 is a schematic view of the computer case structured in a second mode according to the embodiment of the present disclosure.
Figure 4:
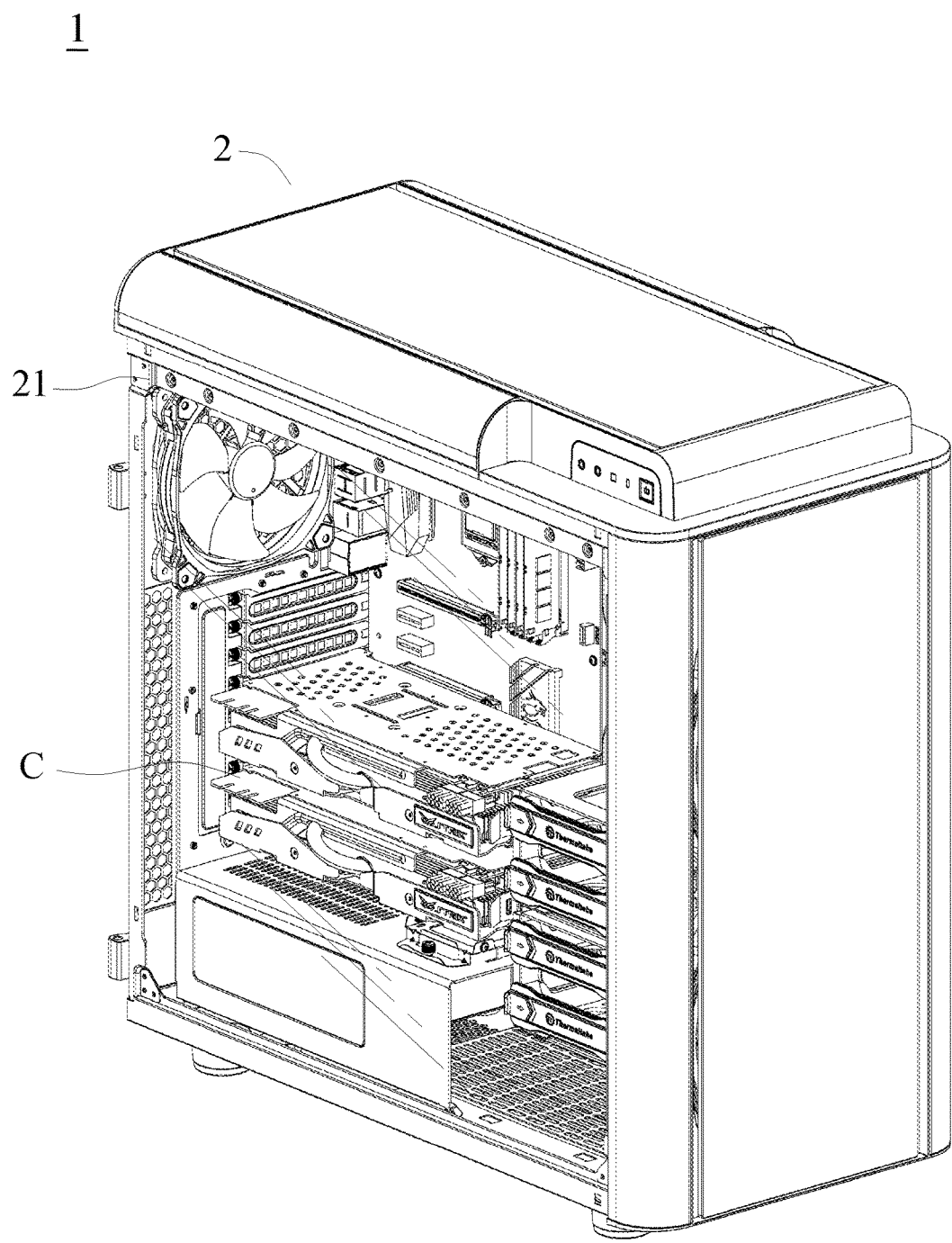
FIG. 4 is a schematic view, from another angle, of the computer case structured in the second mode according to the embodiment of the present disclosure.

As shown in FIG. 3 and FIG. 4, when attached to the back board 21 of the box 2 transversely, the graphics card fixing board 3, the graphics card shields 31 are lengthwise perpendicular to the height of the box 2 (that is, the graphics card shields 31 have an orientation identical to that of their conventional counterparts.) Hence, the graphics card C lies in the box 2 likes its conventional counterpart does.

In this embodiment of the computer case 1, not only is the orientation of the graphics card fixing board 3 variable, but the graphics card C can also be selectively upright or lying when disposed in the box 2, thereby enhancing space efficiency of the computer case 1 despite the variable orientation of the graphics card C in the box 2.

Referring to FIG. 2, in this embodiment, the computer case 1 further comprises a support base 4, a graphics card support 5 and a graphics card adapting line 51. The support base 4 is disposed in an internal space of the box 2 and on a surface of the graphics card fixing board 3, and the surface faces the internal space of the box 2. The graphics card support 5 is erected on the support base 4 to support the graphics card C. The graphics card adapting line 51 connects the graphics card C to a motherboard (not shown). Although the graphics card C thus erected cannot be directly inserted onto a motherboard, the graphics card C is well supported, fixed in place, and electrically connected to the motherboard because of the support base 4, the graphics card support 5 and the graphics card adapting line 51.

However, in another embodiment, the graphics card C thus erected is well supported, fixed in place, and electrically connected to the motherboard because of an element (not shown) other than the support base 4, the graphics card support 5 and the graphics card adapting line 51.

Referring to FIG. 1 and FIG. 3, in this embodiment, the computer case 1 further comprises a fastening component 6. The fastening component 6 fastens the graphics card fixing board 3 to the back board 21 of the box 2 in a manner to allow the graphics card fixing board 3 to be unfastenably attached to the back board 21 of the box 2 either longitudinally or transversely. The fastening component 6 comprises four screws 61, four fixing board seats 62, four first box seats 63, and four second box seats 64.

Referring to FIG. 1, the fixing board seats 62 is disposed at four corners of the graphics card fixing board 3, respectively. The fixing board seats 62 each have a coupling hole (not shown). The first box seats 63 are disposed on the back board 21 of the box 2. The first box seats 63 each have a coupling hole (not shown). The coupling holes of the first box seats 63 correspond in position to the coupling holes of the fixing board seats 62, respectively, whenever the graphics card fixing board 3 is attached to the back board 21 of the box 2 longitudinally. Referring to FIG. 3, the second box seats 64 are disposed on the back board 21 of the box 2 and each have a coupling hole (not shown). The coupling holes of the second box seats 64 correspond in position to the coupling holes of the fixing board seats 62, respectively, whenever the graphics card fixing board 3 is attached to the back board 21 of the box 2 longitudinally. The screws 61 are inserted into the coupling holes of the first box seats 63 and the coupling holes of the fixing board seats 62, respectively (as the first box seats 63 and the fixing board seats 62 overlap), or inserted into the coupling holes of the second box seats 64 and the coupling holes of the fixing board seats 62, respectively (as the second box seats 64 and the fixing board seats 62 overlap) so as for the graphics card fixing board 3 to be longitudinally or transversely fastened to the back board 21 of the box 2.

In this embodiment, given the fastening component 6, the graphics card fixing board 3 is unfastenably attached to the back board 21 of the box 2 either longitudinally or transversely. In a variant embodiment, another fastening component or a coupling component, such as an embedded fastening element, a snap engaging element, or a magnetically engaging element, enables the graphics card fixing board 3 to be unfastenably attached to the back board 21 of the box 2 either longitudinally or transversely.

Referring to FIG. 2, the first lateral board 22 fixes a motherboard in place, whereas the second lateral board 23 is parallel to the first lateral board 22 and made of a transparent material. Hence, not only does the second lateral board 23 face a motherboard disposed in the box 2, but the inside of the box 2 is also visible through the second lateral board 23. In this embodiment, the second lateral board 23 is made of a transparent acrylic material. In a variant embodiment, the second lateral board 23 is made of a transparent material other than a transparent acrylic material, such as fiberglass. In another variant embodiment, not only is the second lateral board 23 made of a transparent material, but the first lateral board 22, the front board 24, the back board 21, the top board 25 and the bottom board 26 are also made of a transparent material. In yet another variant embodiment, only the second lateral board 23 is made of a transparent material.

Conventional graphics cards come with fan-neighboring light-emitting components to illuminate the fans of the conventional graphics cards; however, the conventional graphics cards always lie in the computer case 1, and thus the fans of the conventional graphics cards face the bottom of the computer cases, thereby reducing the illumination of the fans of the conventional graphics cards. By contrast, in the embodiments of the present disclosure, the graphics card fixing board 3 has a variable orientation such that the graphics card is upright when disposed in the box 2, allowing its fan-neighboring side to face the second lateral board 23. If the fan of the graphics card comes with a light-emitting component mounted in place in the box 2, users can watch the illuminated graphics card through the transparent second lateral board 23.

In another embodiment, the box 2 dispenses with a transparent second lateral board but has, for example, a hollowed-out structure whereby users can watch the illuminated fan of the graphics card.

In conclusion, the computer case of the present disclosure has features as follows: the graphics card fixing board is unfastenably attached to the back board of the box either longitudinally or transversely such that the graphics card is selectively lying or upright, so as to enhance space efficiency of the computer case; owing to the transparent second lateral board, if graphics card is upright, users can watch the illuminated fan of the graphics card through the second lateral board.

The present disclosure is disclosed above by preferred embodiments. However, persons skilled in the art should understand that the preferred embodiments are illustrative of the present disclosure only, but shall not be interpreted as restrictive of the scope of the present disclosure. Hence, all equivalent modifications and replacements made to the aforesaid embodiments shall fall within the scope of the present disclosure. Accordingly, the legal protection for the present disclosure shall be defined by the appended claims.

What is claimed is:

1. A computer case, comprising:
    a box having a back board with an opening; and
    a graphics card fixing board comprising a plurality of graphics card shields,
    wherein the graphics card fixing board corresponds in position to the opening of the back board and thereby is unfastenably attached to the back board of the box either longitudinally or transversely, allowing the graphics card shields to be lengthwise parallel to a height of the box whenever the graphics card fixing board is attached to the back board of the box longitudinally, and allowing the graphics card shields to be lengthwise perpendicular to the height of the box whenever the graphics card fixing board is attached to the back board of the box transversely.

2. The computer case of claim 1, further comprising:
    a support base disposed in an internal space of the box and on a surface of the graphics card fixing board, the surface facing the internal space of the box;

a graphics card support erected on the support base; and a graphics card adapting line for connecting a graphics card to a motherboard.

3. The computer case of claim 1, further comprising a fastening component for fastening the graphics card fixing board to the back board of the box.

4. The computer case of claim 1, wherein the box has a first lateral board and a second lateral board, the first lateral board fixing a motherboard in place, and the second lateral board being parallel to the first lateral board and made of a transparent material.

5. The computer case of claim 2, further comprising a fastening component for fastening the graphics card fixing board to the back board of the box.

6. The computer case of claim 2, wherein the box has a first lateral board and a second lateral board, the first lateral board fixing a motherboard in place, and the second lateral board being parallel to the first lateral board and made of a transparent material.

7. The computer case of claim 4, wherein the box has a front board and a top board, both made of a transparent material, and so are the back board and the first lateral board.

8. The computer case of claim 5, wherein the box has a first lateral board and a second lateral board, the first lateral board fixing a motherboard in place, and the second lateral board being parallel to the first lateral board and made of a transparent material.

9. The computer case of claim 6, wherein the box has a front board and a top board, both made of a transparent material, and so are the back board and the first lateral board.

10. The computer case of claim 8, wherein the box has a front board and a top board, both made of a transparent material, and so are the back board and the first lateral board.

* * * * *